United States Patent [19]

Likuski

[11] 4,068,218
[45] Jan. 10, 1978

[54] METHOD AND APPARATUS FOR DEEP DEPLETION READ-OUT OF MOS ELECTRON BEAM ADDRESSABLE MEMORIES

[75] Inventor: Robert K. Likuski, Castro Valley, Calif.

[73] Assignee: Micro-Bit Corporation, Lexington, Mass.

[21] Appl. No.: 729,274

[22] Filed: Oct. 4, 1976

[51] Int. Cl.² .................... G11C 11/26; G11C 13/00
[52] U.S. Cl. .................. 365/237; 365/174; 365/118
[58] Field of Search ...... 340/173 R, 173 LS, 173 LT, 340/173 CR; 357/31; 313/65 AB

[56] References Cited

U.S. PATENT DOCUMENTS

| 3,761,895 | 9/1973 | Ellis et al. ..................... 340/173 CR |
| 3,763,476 | 10/1973 | Wilson et al. ................. 340/173 CR |
| 3,786,441 | 1/1974 | Engeler et al. ................. 340/173 R |

Primary Examiner—Terrell W. Fears
Attorney, Agent, or Firm—Charles W. Helzer

[57] ABSTRACT

A method and apparatus for deep depletion read-out of data stored in a metal-insulator-semiconductor-metal capacitor memory element wherein a predetermined read-out potential is established across the memory capacitor while discrete storage sites within the capacitor are interrogated by a scanning electron beam probe and the magnitude of the resultant memory capacitor discharge current obtained from probing a particular site with the electron beam is indicative of the character of data stored at the site. The improvement comprises applying a voltage step across the capacitor memory element just prior to read-out with the electron beam, the voltage step corresponding in polarity to the polarity of the majority carriers in the semiconductor. In one embodiment of the invention the capacitor memory element employing two electrical contacts is comprised by a gate metal layer-oxide insulating layer-P-type semiconductor-metal backside layer and the voltage step is a positive going voltage step occurring at the trailing edge of a negative voltage pulse applied to the gate metal layer relative to the backside metal layer from a source of variable potential. The negative voltage pulse is either applied just prior to the commencement of each line of scan of the electron beam probe or immediately prior to the commencement of a succession of scans of the electron beam probe. The pulse is followed by a steady state value of read-out potential. In a preferred form of the invention, a capacitor memory element employing two electrical contacts and including an N-type semiconductor layer overlying a substrate P-type semiconductor layer and covered by an oxide insulator layer is employed with similar pre-read biasing treatment.

14 Claims, 7 Drawing Figures

METHOD AND APPARATUS FOR DEEP DEPLETION READ-OUT OF MOS ELECTRON BEAM ADDRESSABLE MEMORIES

BACKGROUND OF INVENTION

1. Field of Invention

This invention relates to a method and apparatus for improved read-out of data stored in a metal-insulator-semiconductor memory capacitor of the type employed in electron beam addressable memories.

More particularly, the invention is directed to a novel, deep depletion read-out method and apparatus for an electron beam addressable memory of the type employing a metal-insulator-semiconductor memory capacitor element and to improved memory capacitor elements therefor.

2. Background of Invention

An electron beam addressable memory employing a metal-insulator-semiconductor memory capacitor element was first described in an article entitled "Electron Beam Detection of Charged Storage in MOS Capacitors", Applied Physics Letters, Volume 16, No. 4, pages 147-149, Feb. 15, 1970 and has been detailed further in U.S. Pat. No. 3,736,571, issued May 29, 1973 and U.S. Pat. No. 3,886,530, issued May 27, 1975. To further improve the response and the character of the output signals obtained from such an electron beam addressable memory, the present invention was devised.

SUMMARY OF INVENTION

This invention relates to a novel method and apparatus for deep depletion read-out of MOS electron beam addressable memories and significantly improves the output signals obtained during the read-out operation. Deep depletion read-out also substantially increases the usable life of the MOS (metal-oxide-semiconductor) memory capacitor elements in that it delays production of impractically small signal levels from such memory capacitor elements.

In practicing deep depletion read-out, a MOS memory capacitor structure is employed and may be comprised by a P-type semiconductor substrate having an overlying oxide layer insulator with a thin conductive coating of metal covering the oxide insulator layer (hereinafter referred to as the gate metal layer or just simply the gate). A preferred structure is comprised by a P-type semiconductor substrate having a N-type semiconductor overlayer with an oxide insulator layer covering the N-type semiconductor layer that in turn is covered by a thin conductive (gate metal) coating. Hereinafter, the first mentioned structure will be referred to as an induced junction device whereas the last mentioned structure will be referred to an a buried junction device. With such structures, a positive going voltage step is applied to the gate (metal layer) of the MOS memory capacitor structure just prior to readout with the final value of the gate to substrate voltage of the MOS capacitor structure being the read voltage value. This positive going voltage step drives the MOS structure into a state of deep depletion as will be explained further hereinafter. Although even a small voltage step, of the order of 5 volts, can be used, even larger voltage steps can produce larger benefits within limits. A convenient positive going voltage step is the one going from a negative gate bias value to read bias value, a voltage step of about + 20 volts.

Since a negative going voltage step prior to the positive going voltage step does not negate the effect of the positive going voltage step, a MOS capacitor structure employing either a P-type semiconductor substrate above or the N/P-type structure described briefly above, can be driven into deep depletion with a negative voltage pulse which goes to a voltage value just prior to read-out. Such a negative voltage pulse would be used if the gate voltage were at a value unsuitable for the use of a positive going voltage step just prior to read-out. Such a condition would exist if the MOS memory structure were at "charge" voltage value just prior to read-out, or if the deep depletion condition had collapsed due to an extended dwell time at read bias. As used hereinafter, the terms "charge" and "discharge" will be used, respectively, in place of "write one" or "written" and "write zero" or "erased" as defined in the above referenced U.S. Pat. Nos. 3,736,571 and 3,886,530. A voltage pulse starting at read voltage, going to discharge voltage and thereafter returning to read voltage could be used periodically to drive the MOS memory capacitor structure into deep depletion during a prolonged read operation. For example, at the commencement of the scanning of each line of data or groups of lines of data such a voltage pulse would be applied to precondition the memory capacitor for deep depletion read-out.

Deep depletion read-out also can be used for MOS memory capacitor structures employing an N-type semiconductor substrate or an N-type semiconductor substrate having a P-type semiconductor overlayer covered by an oxide insulator layer and thin conductive coating. With such structures, a negative going voltage step applied to the gate of the MOS memory capacitor structure would be employed in order to drive the N-type semiconductor or the junction into deep depletion.

In practicing the invention, a method and apparatus for deep depletion read-out of data stored in a metal-insulator-semiconductor capacitor memory structure is provided. During read-out a predetermined read-out potential is established across the memory capacitor while discrete storage sites are interrogated by an electron beam probe. Concurrently, the magnitude of the resultant capacitor discharge current obtained from probing a particular data site with the electron beam is measured and provides an analog indication of the character of the data stored at the site, such data being quantized (e.g. binary) or analog in character. Improved signal response having an improved signal to noise ratio is obtained by driving the memory capacitor structure into deep depletion prior to read-out. This is achieved by applying a voltage step across the capacitor memory structure just prior to read-out with the electron beam, the voltage step applied to the gate corresponding in polarity to the polarity of the majority carriers in the underlying substrate semiconductor layer.

BRIEF DESCRIPTION OF DRAWINGS

The above, and other objects, features and many of the attendant advantages of this invention will be appreciated more readily as the same becomes better understood by reference to the following detailed description, when considered in connection with the accompanying drawings, wherein like parts in each of the several figures are identified by the same reference character, and wherein:

FIG. 1B (a) through FIG. 1B (d) illustrates a series of voltage versus time characteristic curves depicting the nature of certain enabling potentials employed with the system of FIG. 1A;

Figure 3:
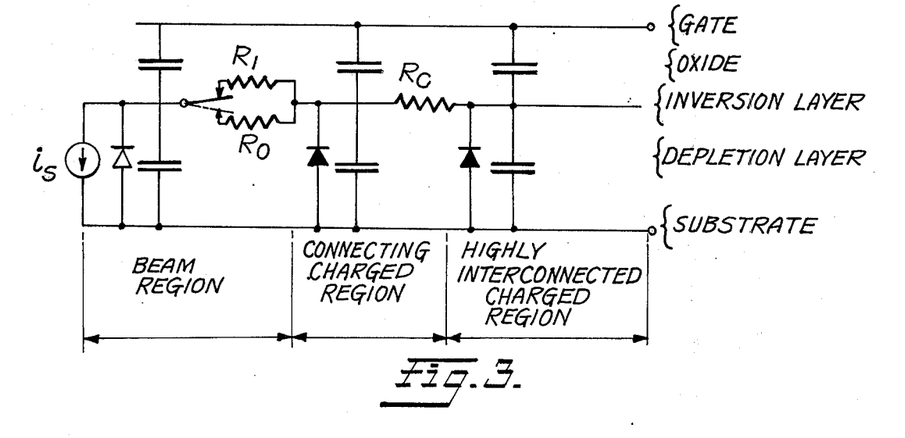
FIG. 3 is a non-linear circuit model which illustrates the physical processes involved during read-out of a MOS memory capacitor structure of the induced junction electron beam addressable type.
Figure 4:
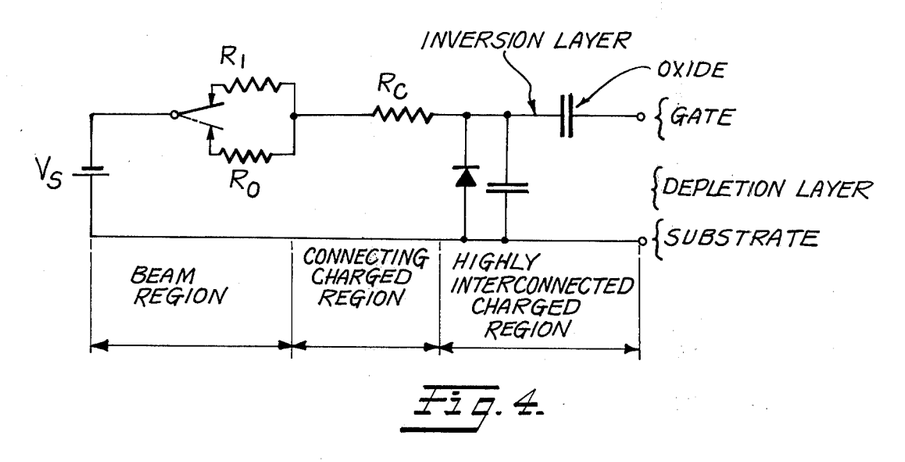
FIG. 4 is a simplified version of the circuit model shown in FIG. 3 based on certain simplifying assumptions.

Circuit models for the buried junction memory capacitor structure corresponding to those shown in FIGS. 3 and 4 for the induced junction device, are described in copending U.S. application Ser. No. 729,099, filed concurrently with this application, Floyd O. Arntz, inventor and assigned to Micro-Bit Corporation.

DETAILED DESCRIPTION OF PREFERRED EMBODIMENTS

Figure 1A:
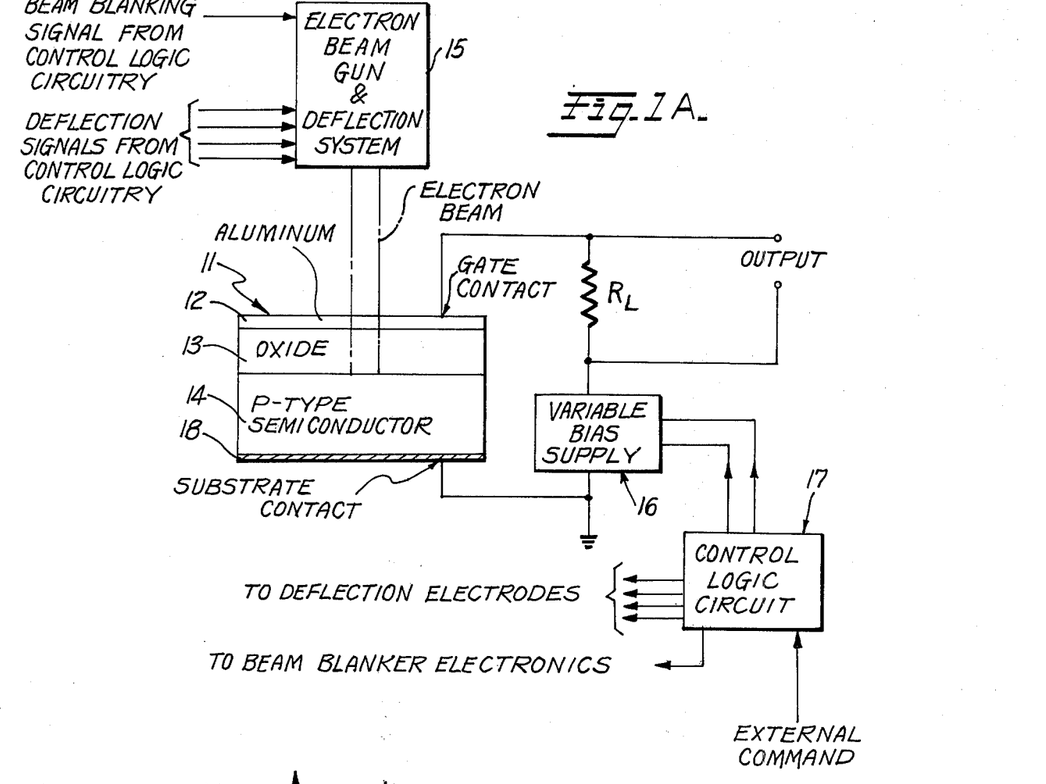
FIG. 1A is a schematic, functional block diagram of an electron beam addressable MOS capacitor memory constructed in accordance with the invention and which can be employed to practice the novel deep depletion read-out method which is the subject of the invention.
Figure 1B:
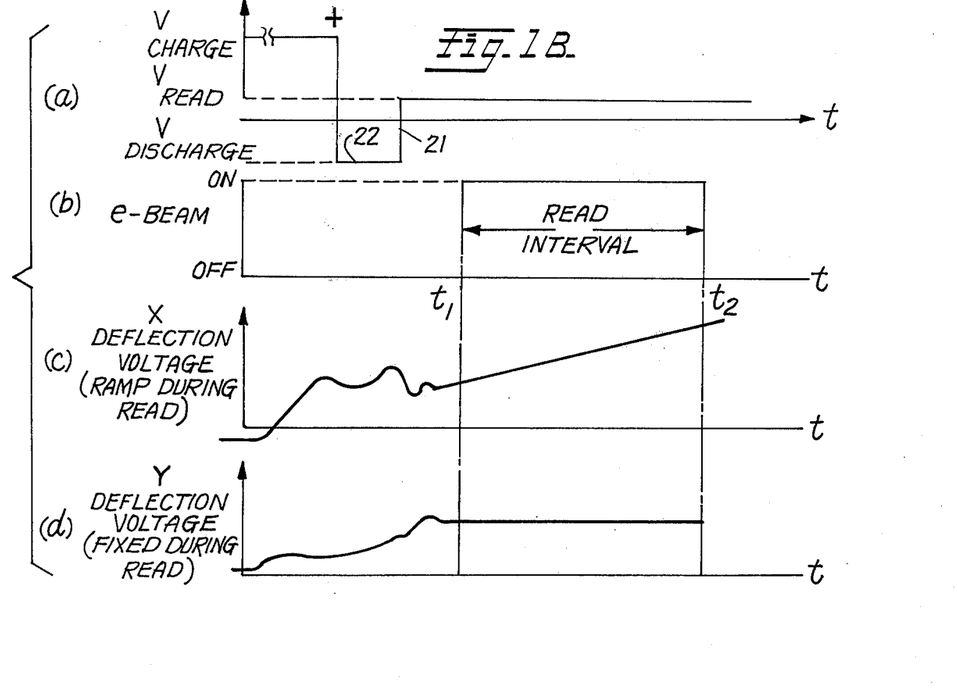

FIG. 1A is a schematic functional diagram of an apparatus for performing the improved deep depletion read-out of binary data bits stored in an induced junction metal-oxide-semiconductor memory capacitor structure shown at 11. The memory capacitor structure 11 is comprised by a homogeneous semiconductor substrate 14 formed by a chip of single crystal, P-type silicon having a resistivity of approximately 1.0 ohm-centimeters and of the order of 100 dislocations per square centimeter. As an example of the physical dimensions, the chip may be 2 centimeters by 2 centimeters square and about 0.2 millimeters thick. A silicon dioxide ($SiO_2$) layer 13 of about 2000 Angstroms thick is formed on the upper surface of the semiconductor chip by heating the chip in the presence of dry oxygen in a conventional manner. A thin film 12 of aluminum, for example, having a thickness of about 500 Angstroms is vaccum deposited over the surface of the silicon dioxide layer 13 with suitable goldlands or other forms of ohmic contact secured to the metal layer 12. A similar conducting layer 18 is formed on the backside or under surface of semiconductor substrate 14 for providing electric contact to the structure. An electron beam gun of known construction is shown at 15 for providing an electron beam probe for writing and reading-out data recorded in the memory capacitor in the manner to be described hereinafter. For a more detailed description of the MOS memory capacitor structure 11 as well as a suitable electron beam gun construction, reference is made to either of the above identified issued U.S. Patents.

During both writing and reading operations, a suitable biasing potential is applied across the contact connected to the respective metal layer 12 and the underside of the P-type semiconductor 14 from a variable voltage bias supply source shown at 16 through a suitable load resistor $R_L$. Output signals derived from the memory capacitor structure are obtained across the load resistor $R_L$. In practice $R_L$ has a value less than 100 ohms. The variable voltage bias supply source 16 in turn is controlled from a control logic circuit shown at 17. The control logic circuit 17 is under the control of an external command signal source as the input/output of a computer system. The control logic circuit 17 operates to change the voltage supplied by the variable bias supply source 16 across the memory capacitor structure 11 during write and read operations in conjunction with the scanning of the electron beam probe provided by electron beam gun 15 and its deflection system. For this purpose, the control logic circuit 17 also coordinates the supply of suitable deflection signals and beam blanking signals to the electron beam gun 15 and its deflection system. For a more detailed description of this part of the system, reference is made to the above identified issued U.S. Pat. No. 3,736,571.

In operation, information is stored and subsequently retrieved from the memory capacitor structure 11 in the following manner. For convenience, the description will be confined to a memory capacitor structure employing a P-type semiconductor substrate layer as shown in FIG. 1 at 14, or to a preferred buried layer memory capacitor structure employing a P-type semiconductor substrate layer having a buried N-type layer defining a N/P junction as shown in FIG. 2C. It should be kept in mind that structures employing N-type semiconductor substrates also can be used; however, for a number of reasons, it is preferred to employ P-type semiconductor substrates as will be explained more fully hereinafter. To record data within a region of the MOS memory capacitor structure, the electron beam from electron gun 15 is scanned over the region and either a positive or a negative bias potential is applied to the gate of the structure from the variable bias supply 16 in accordance with the data to be recorded at particular bit sites. The electron beam has sufficient energy to penetrate through the metal film 12 and oxide layer 13 into the semiconductor layer 14. To charge the oxide, a large positive potential shown as $V_{CHARGE}$ in FIG. 1B of the drawings is applied to the gate across the memory capacitor structure from variable bias supply 16. At points within the region where the electron beam impinges simultaneously with the application of the $V_{CHARGE}$ potential, positive charges will be stored in the oxide layer 13 near the interface of the oxide layer with the semiconductor layer 14. In regions where the electron beam is not allowed to impinge, electric charges will not be stored in the oxide layer 13. At points within the region where the electron beam impinges simultaneously with the application of a negative $V_{DISCHARGE}$ potential, positive charge previously stored in the oxide layer 13 will be removed. For binary data storage purposes, one binary state is correlated with positive charge stored near the oxide-semiconductor interface while the other binary state is correlated with an absence of positive charge near the interface. For induced junction memories a more refined definition of the two binary states is needed, as will be shown in detail later. For the purpose of multilevel data storage, which may be quantized or continuous (analog), the stored data at each site is correlated with the quantity of positive charge stored near the oxide-semiconductor interface. For convenience, in the following discussion the storage will be regarded as binary and regions of the memory capacitor structure in which positive charge is stored near the interface, will be referred to as being charged and regions in which there is no positive charge or the positive charge is substantially removed, will be referred to as being discharged. The process of determining whether a region of the memory capacitor structure is charged or discharged will be referred to hereinafter as read-out. For a more detailed description of the recording process, reference is made to the above identified U.S. Pat. No. 3,886,530.

As stated above, memory capacitor structures using P-type semiconductor substrates as illustrated in FIGS. 1 and 2C, are preferred. However, structures with N-type semiconductors also can be used. The processes of charging and/or discharging selected bit site locations is accomplished in the same manner irrespective of whether an N-type or a P-type semiconductor substrate is employed. To charge or discharge a bit site on the MOS memory capacitor structure, the electron beam is allowed to impinge on that site with either a charge or discharge bias potential applied to the gate of the structure relative to the substrate, the charge bias potential is positive from gate to substrate while the discharge potential is negative. To read a region, that is to determine whether the region is charged or discharged as defined above, the region is interrogated with the electron beam in conjunction with the application of a suitable read bias potential applied to the gate contact from the variable bias supply 16 through resistor $R_L$. For memory capacitors having a N-type semiconductor substrate and having a silicon dioxide insulator, the read bias is very negative and is dependent to a considerable extent on the density of positive charge stored in the charged regions. For a P-type semiconductor, the read bias shown at $V_{READ}$ in FIG. 1B (a) is in the vicinity of zero volts, and it is practically independent of the density of positive charge stored on the charged regions. It is primarily because of these read bias considerations that memory capacitor structures employing P-type semiconductor substrates are preferred over those with N-type semiconductor substrates. It follows from the above discussion, that since negative charge is not stored in the conventional silicon dioxide insulator layer for structures containing N-type semiconductors, such memory capacitor structures cannot be merely treated as the dual of the P-type structure. It should be noted, however, that insualtors such as $Si_3N_4$, $Al_2O_3$ and specially treated silicon dioxide layers can store negative charge and hence complementary N-type silicon memory capacitor structures are feasible. By considering a read bias potential whose polarity and magnitude are appropriate to the semiconductor substrate used in the memory capacitor structure, interchanging the roles of charged and discharged regions and the roles of electrons and holes, the read mechanisms in structures having a silicon dioxide insulator and either P or N-type semiconductor substrates are essentially the same in a physical sense. For brevity, however, the remaining description will be confined to memory capacitor structures using P-type semiconductor substrates as shown in FIGS. 1A, 2B and 2C.

In the earlier work with MOS memory capacitor electron beam addressable memories, as disclosed in the Applied Physics Letters article, it was indicated that binary information could be stored in the form of isolated charged sites as well as isolated discharged sites. It has been correctly shown in later filed U.S. Pat. No. 3,736,571 that binary information represented by this earlier approach was unreadable in memory capacitor structures of the induced junction type by convenient methods unless the size of the isolated charged site became impractically large. It was further disclosed in U.S. Pat. No. 3,736,571, however, that binary information could be stored at high densities on induced junction memory capacitor structures if the nature of the two binary states were further refined. Two suitable binary states were shown to be a large charge interconnected area, referred to as the charged background, and small discharged sites in this background. The physical mechanism involved in reading binary information stored in the induced junction memory capacitor structure through the use of these further refined two binary states, allowed a much improved signal to noise ratio and a much improved density of recorded information. The present invention provides a technique and apparatus for driving the memory capacitor structure into a state of deep depletion prior to read-out and further improves the character of the output signal derived during the read process.

For the purpose of the present disclosure, the effect of surface states created at the oxide-semiconductor interface, initially will be ignored in the following description of the read mechanism and then reintroduced by considering the manner in which they modify the read mechanisms. However, it is known that during usage of an MOS memory capacitor structure surface states are created at the oxide-semiconductor interface and these surface states play a significant role in the read mechanisms.

Figure 2A:
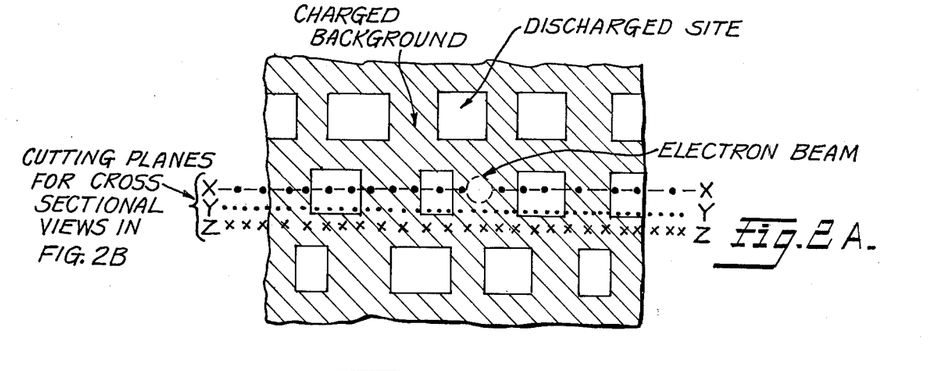
FIG. 2A is a partial plan view of a portion of the surface of a MOS memory capacitor structure and constitutes an artist's conception of how the surface of the structure might appear if it could be viewed optically to define areas where positive charge has been stored in the overlying oxide layer insulator near the semiconductor (charged background) as opposed to areas in which this charge has been neutralized (discharged sites)
Figure 2B:
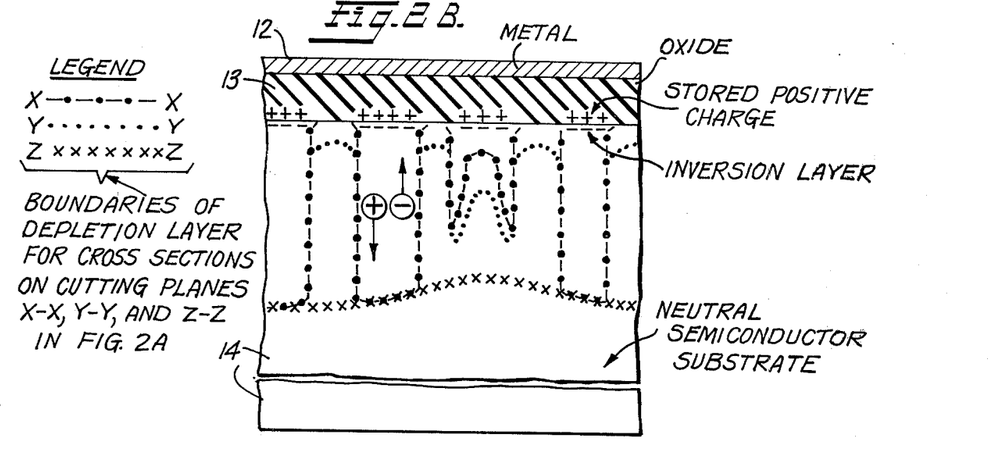
FIG.2B illustrates a series of sectional views of a MOS memory capacitor of the induced junction type shown in FIG. 1A formed from a single P-type semiconductor layer and assuming that such a structure is viewed as shown in FIG. 2A along planes X—X, Y—Y and Z—Z, respectively.
Figure 2C:
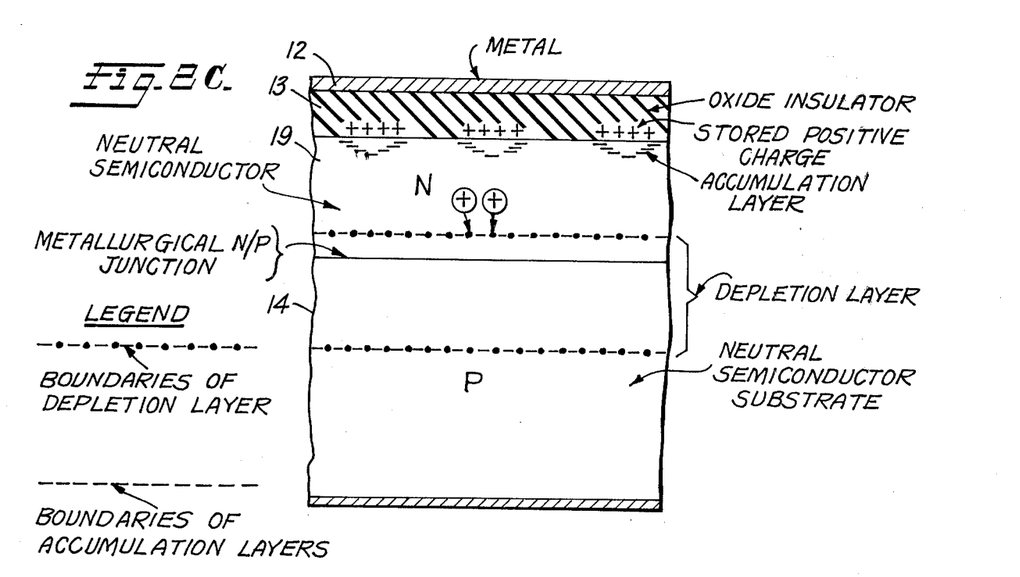
FIG. 2C illustrates a sectional view of a preferred form of buried junction MOS memory capacitor structure having a buried N/P junction and assuming that such a structure is viewed along plane X—X as shown in FIG. 2A.

FIG. 2A of the drawings illustrates a portion of the surface of an MOS memory capacitor structure having a pattern of discharged sites (shown as clear areas) disposed within a charged background (cross hatched) which extends over the remainder of the surface of the memory capacitor structure. A dashed outline circle shown in the center of the figure represents an electron beam that is incident on the structure for read-out purposes. FIG. 2A should be considered as depicting a top planar view which is true for the induced junction memory capacitor structure of FIG. 2B. FIG. 2A may also be considered as depicting a top planar view of the buried junction memory capacitor of FIG. 2C, however, if regarded as depicting the buried junction device, the charged regions need not interconnected.

With respect to FIG. 2B, the three straight lines X—X designated with dash-dots, Y—Y designated with dots and Z—Z designated with crosses in FIG. 2A, represent cutting planes to which the cross sectional views of FIG. 2B correspond. The three stratified layers shown in FIG. 2B are the metal gate 12 (or in general any conducting surface layer), the insulating layer 13 of silicon dioxide (although other insulating layers are useable) and the P-type silicon substrate 14. FIG. 2C depicts a preferred form of memory capacitor structure for practicing the invention and comprises a memory capacitor employing a N-type layer forming a buried N/P junction with the P-type substrate. However, for simplicity in presentation, the following discussion applies specifically to a metal-silicon dioxide-semiconductor memory capacitor structure employing a single P-type silicon substrate 14 as as shown in FIG. 2B. The "+" symbols in FIG. 2B correspond to positive charges stored in the oxide near the oxide-semiconductor interface and the "−" symbols correspond to a highly conducting layer, the inversion layer, induced in the semiconductor near the oxide-semiconductor interface by the positive charges stored in the oxide insualtor layer. As stated earlier, it is recognized that other useful memory capacitor structures can be built with different combinatons of layers. For example, an insulator which stores negative charge and an N-type semiconductor could be used.

The stored charge-inversion layer pattern shown in FIG. 2B corresponds to the cutting plane illustrated by the dash-dot line X—X of FIG. 2A. As shown in FIG. 2B the dash-dot line also serves to define the boundary of the depletion layer that is produced in the body of the semiconductor 14 along the X—X cutting plane as a consequence of the presence of the stored positive charges in the oxide layer near the oxide-semiconductor interface. The dotted lines in FIG. 2B correspond to the boundaries of the depletion layer at a cross section corresponding to the cutting plane illustrated by the dotted lines Y—Y of FIG. 2A. Finally, the line formed with the crosses in FIG. 2B illustrates the boundary of the depletion layer at a cross section corresponding to the cutting plane illustrated by the line of crosses Z—Z shown in FIG. 2A. For the conditions illustrated in FIG. 2B a suitable read potential in the vicinity of zero volts is assumed to be applied between the gate and substrate of the memory capacitor structure by the variable bias supply 16.

In the memory capacitor structure shown in FIG. 2B the depletion layer extends within the semiconductor body to varying depths depending upon whether a region is charged or discharged, and within the depletion layer, majority carriers (holes) have been almost totally excluded. Negatively charged acceptor ions, no longer neutralized by positively charged holes, produce an electric field in the depletion layer which tends to drive any injected electrons to the semiconductor-oxide interface, and to drive injected holes away from this interface. If the semiconductor is uniformly doped, the electric field strength is proportional to the distance of the field point from the boundary between the depletion region and the neutral semiconductor. The potential at a field point increases as the square of the distance of the field point from that boundary. It might be noted that the potential of an electron is the negative of this potential. Neglecting the possibility of field lines orginating in the MOS memory capacitor structure terminating on a remote structure or vice versa, and, as previously noted, temporarily neglecting defect states such as surface states, all of the field lines crossing the interface between the oxide insulator and the semiconductor originate either at positive charges at the surface of the metal gate or the positive charges stored in the oxide layer near the oxide-semiconductor interface and terminate on negatively charged acceptor ions in the depletion layer or electrons in the inversion layer. In equilibrium the ratio of negative charges supplied by electrons in the inversion layer to those supplied by ionized acceptor ions is determined through the use of Fermi-Dirac statistics and Poisson's equation.

In the buried junction memory capacitor structure shown in FIG. 2C, a different phenomenon occurs. For a more complete description of the buried junction (also referred to as a buried layer) memory capacitor structure, reference is made to copending U.S. Application Ser. No. 729,099, filed concurrently with this application, Floyd O. Arntz, inventor, and assigned to Micro-Bit Corporation. Briefly, however, it will be seen in FIG. 2C that the structure is comprised by an additional buried N-type semiconductor layer 19 formed over the P-type layer 14 by diffusion, ion implantation or epitaxial growth techniques. The oxide insulator 13 then is formed over buried N layer 19 by suitable thermal treatment in an oxidizing atmosphere followed by deposition of a conducting film 12. A conducting surface 18 then is provided to the remaining planar face of the P-type substrate. Such a lower conducting surface 18 also preferably is provided to the P-type substrate of the induced junction memory capacitor structures shown in FIGS. 1A and 2B.

In the FIG. 2C structure the depletion region extends uniformly on each side of the interface of the metallurgical P-N junction as shown and is relatively unaffected by the presence or absence of positive charges stored in the oxide insulator layer. However, since the N-type layer interfaces with oxide insulator layer 13, an accumulation layer of majority carrier electrons will be produced under all charged regions of the oxide insulator near the oxide N layer interface. Upon impingement of a reading electron beam into the N layer electron-hole pairs will be created as noted previously. Under the discharged regions of the oxide insulator, the holes thus injected diffuse randomly and for the most part recombine at the oxide-semiconductor interface without contributing significantly to the read-out current. However, under the charged regions, the injected holes tend to be repelled by the positive charges stored in the oxide insulator near the oxide-semiconductor interface, consequently a significant number of the positively charged holes diffuse in the neutral N-layer until they encounter the depletion layer separating the neutral portions of the N-type and P-type layers, and are collected by the P-type layer. Capture of an increased number of holes by the deeply depleted junction is enhanced under the charged areas and contributes significantly to a reverse junction current flow across the N/P junction. This increases current flow then may be distinguished readily from the flow induced during impingement of the read-out electron beam in a discharged region of the memory capacitor structure.

If a non-equilibrium condition is produced by rapidly increasing the density of positive charges on the surface of the gate of the memory capacitor structure (such as is accomplished by a rapid positive going change of the gate to substrate potential through the use of the variable bias supply 16 shown in FIG. 1A) then other considerations than those noted previously are involved. The rate at which the density of electrons in the inversion layer of the FIG. 2B device, or the extrinsic N-type buried layer of the FIG. 2C device, can increase is determined by the rate at which electrons can be supplied to the inversion layer. If the dominant source of electrons is thermal electron-hole generation in the existing depletion layer, then very long times, of the order of a second, could be required before equilibrium is established. In this non-equilibrium condition, referred to as "deep depletion", the depletion region is widened, exposing more than the equilibrium value of charged ionized ions. There also is an accompanying decrease in device capacitance. As a consequence, the capture of holes during read-out is enhanced and results in an improved read-out signal.

Referring only to the induced junction device of FIG. 2B, the opposite non-equilibrium condition, in which the inversion layer contains more than its equilibrium share of negative charges, can be produced by injecting holes and electron pairs into the depletion layer. Injection of electrons and holes into a semiconductor is a general concept which includes the process of generating hole-electron pairs with a penetrating electron beam. The injected electrons drift to the oxide-semiconductor interface, driven by the electric field in the depletion layer. At the interface they either accumulate, move laterally along the interface or recombine with holes. Although it is not generally an accepted term, this non-equilibrium condition will be referred to hereinafter as "enhanced recombination". It should be appreciated that even a low density of injected hole-electron pairs will produce immediately enhanced recombination if the MOS memory capacitor structure is initially in equilibrium. However, if the structure initially is in deep depletion, as defined above, enhanced recombination is not immediately produced. All regions of the structure which the injected electrons can reach by lateral flow via the inversion layer will, however, eventually reach a state of enhanced recombination unless the injection of hole-electron pairs is stopped, or the state of deep depletion is periodically induced. An intermediate condition may be reached at some point for which parts of the structure are in enhanced recombination and parts are in deep depletion. The parts in a state of enhanced recombination normally will be in the vicinity of the injected hole-electron pairs or regions easily reached via the inversion layer by the injected electrons.

A better understanding of the principles described above perhaps can best be achieved through the use of circuit equivalents. The non-linear circuit model illustrated in FIG. 3 of the drawings was developed as a compromise between completeness and simplicity for use in illustrating the process of read-out of data from MOS electron beam addressable memories of the induced junction type shown in FIG. 2B. From a consideration of FIG. 3, it will be appreciated that the lateral dimensions of the MOS memory capacitor structure have been divided into three regions comprised by the beam region where the electron beam impinges on the memory capacitor as illustrated by the dashed outline circle in the center of FIG. 2A. The next adjacent region is identified as the connecting charged region (C. C. region) and is a region in which the finite surface conductivity of the inversion layer has a significant effect on the read-out signal. Generally this region will be adjacent to the electron beam region in a physical sense. The third and last region depicted by the circuit model of FIG. 3 is identified as the highly interconnected charged region (H. I. C. region) wherein the multiplicity of paths by which electrons can flow laterally through the inversion layer is so large that no appreciable impediment to their lateral flow exists.

As depicted in FIG. 3, the beam region consists of the area impinged upon by the electron beam and its immediate neighborhood in which electrons from the electron beam generated hole-electron pairs can easily reach without being transported by the inversion layer. The current generator, $i_s$, represents the flow of conduction electrons from their point of creation to the inversion layer. It might be noted at this point that this current is in the direction of conventional current rather than electron flux. The resistances $R_0$ and $R_1$ represent an impedance preventing electrons generated within the beam region from spreading laterally out of this region. The switch symbolizes that the electron beam generated electrons must flow through $R_1$ under conditions where the electron beam impinges on a charged background and through $R_0$ under conditions where the beam impinges on a discharged site. Since a highly conducting inversion layer exists throughout the beam region in the case where the beam impinges on the charged background, the impedance $R_1$ is relatively small. Due to adverse geometrical considerations the value of $R_1$ is non-negligible, however, even though the surface conductivity of the inversion layer is high due to the charged background within the C. C. region. Since no inversion layer exists under a discharged site for a proper read bias, the value of $R_0$ is large. Keeping in mind the initial assumed condition to ignore surface states at this point in the description, the values of $R_0$ is non-infinite only because of diffusion processes.

Electrons from the beam generated hole-electron pairs tend to diffuse laterally as they drift in the depletion layer field during their movement towards the oxide-semiconductor interface. The further the electrons are generated from the interface the more they spread laterally before they reach the interface. Some of the electrons thus can escape from the discharged region by bulk diffusion. In addition, because of surface states which eventually we must recognize, some surface conduction can occur in an inversion layer formed under a discharged site as will be explained more fully hereinafter, which also reduces the value of $R_0$. Experimental studies have shown that when a penetrating electron beam impinges on a MOS memory capacitor structure, states which can capture an electron and render it immobile or can support recombination of the electrons with holes, are produced in large numbers at the oxide-semiconductor interface. Using band theory terminology, these states are distributed in energy throughout the forbidden band, between the conduction and the valence band, with a large peak in density adjacent to the conduction band. When these states capture an electron they provide alternate points for termination of the electric field lines as previously discussed. In the presence of a large concentration of such states the density of inversion layer electrons has a very weak dependence on the gate to substrate potential as well as on the density of positive charges stored at the oxide-semiconductor interface in contrast to the sharp onset predicted by the Fermi-Dirac statistics coupled to Poisson's equation in the absence of surface states.

Because of limits to the density of the positive charges that can be stored at the oxide-semiconductor interface in a charged region, after the density of surface states has exceeded a certain value it becomes no longer possible to find a read bias potential value for which no inversion layer will exist under a discharged site, and an adequately conducting inversion layer exists under the charged background. The situation is made even worse by a reduction in the mobility of inversion layer electrons because of electron beam induced defects at the oxide-semiconductor interface. In practice, a compromise is reached between high inversion layer surface conductivity in the charged background and low inversion layer surface conductivity under discharged sites by choosing a suitable read bias potential.

Including surface states, the ratio between $R_1$ and $R_0$ may not be large. Also, because of surface states, in reality a depletion region will exist under discharged sites as well as under the charged background. This is contrary to the idealized situation depicted in FIG. 2B of the drawings where no depletion region is shown under discharged sites. Because mobile holes are absent from the depletion region, the depletion region can be treated as a capacitor in the equivalent circuit shown in FIG. 3 of the drawings. The magnitude of this capacitance is directly proportional to the area of the depletion region and inversely proportional to its depth. In a state of deep depletion as defined above, the equivalent depletion region capacitors are smaller than their equilibrium value and in a state of enhanced recombination they are larger. The diodes shown in the equivalent circuit of FIG. 3 in parallel with the depletion region capacitance, represent electron-hole recombination in the regions in question. In a state of deep depletion these diodes are reversed biased and in a state of enhanced recombination they are forward biased. The oxide layer capacitance also is represented by three lumped capacitances in FIG. 3 and their value is likewise directly proportional to the area of the region in question and inversely proportional to the oxide layer thickness.

The region of the MOS memory capacitor structure designated as the C. C. region in FIG. 3, is a region in which the finite surface conductivity of the inversion layer under the charged background has a significant effect on the value of the read-out signal. The portion of the charged area that must be included in this C. C. region depends on the inversion layer surface conductivity in the charged area, and hence on the surface state density. The poorer the inversion layer surface conductivity the larger the C. C. region. The resistance $R_c$ represents an impedance to the flow of electrons via the inversion layer in the C. C. region. In the region designated as the H. I. C. (highly interconnected charged region), the multiplicity of paths by which electrons can flow laterally is so large that no appreciable impediment to their lateral flow exists. Current generators representing thermally generated hole-electron pairs also could be included in all regions; however, for semi-conductors which are reasonably free of mid gap trapping centers, such thermally generated hole-electron pairs do not significantly affect the read-out mechanism, and hence they have not been shown. There could be some merit in representing the C. C. region as a distributed transmission line, however, for the present purposes the additional complexity thus introduced would outweight any advantages gained by the more complex representation.

In the immediate following description concerning the device of FIG. 2B, the effect of surface states will be included. When an electron beam impinges on a discharged site within the charged background for the purpose of read-out, electrons from the hole-electron pairs generated in the depletion layer (remember we are including the effect of surface states at this point) drift towards the oxide-semiconductor interface where they either accumulate, spread laterally or recombine. Steady state is reached almost instantaneously in the tiny electron beam region. The steady state condition will be a state of enhanced recombination unless the initial state was deep depletion and lateral spreading is the dominant mechanism. When the electron beam impinges on a discharged site, lateral spreading does not dominate hence the steady state is always the non-equilibrium state of enhanced combination under a discharged site. At this point it should be noted that it is highly desirable that the beam region within a discharged site be in a state of enhanced recombination when the electron beam interrogates the discharged site because of the following considerations. In a state of enhanced recombination the depth of the depletion region is narrower than the penetration depth of the electron beam. Electron-hole pairs generated within the semiconductor beyond the depletion region are not separated by strong electric fields and hence are more likely to recombine in the vicinity of where they are generated. Failure of these electrons to reach the oxide-semiconductor interface results in a decrease in the electron beam generated current, $i_s$, in FIG. 3, and moreover results in an increase in the value of $R_0$. The increase in the value of $R_0$ is realized due to the fact that it those electrons generated far from the interface that are most serious in decreasing the value of $R_0$ through lateral diffusion processes discussed above.

As opposed to a discharged site, when the electron beam impinges on the charged background, a somewhat different phenomenon occurs from that discussed above for impingement of the electron beam within a discharged site. Assuming a condition of initial deep depletion, if lateral spreading does dominate when the electron beam impinges on the charged background, the beam region conceivably could remain in its initial state of deep depletion. However, because of reduced inversion layer surface conductivity due to surface states, the steady state condition of the beam region during interrogation by the electron beam tends toward the state of enhanced recombination even when the charged background is being interrogated. The transient involved when the beam region goes from its initial state of deep depletion to steady state is coupled to the gate electrode via the small oxide capacitance in the beam region, but is coupled back to the substrate by the capacitance of the rest of the device. This transient thus could be detected only through the use of a very low input impedance sensing circuit having a very high cut-off frequency. Since sensing circuits normally used do not detect transients of this nature, a practical equivalent circuit model of the beam region, thus, need only reflect its steady state condition. Consequently, some linearization and simplification of the equivalent circuit model of FIG. 3 is possible in the beam region. The beam region is adequately represented as a constant voltage source. If the inversion layer surface conductivity is charged regions is high, then the C. C. region of FIG. 3 is small compared to the H. I. C. region. In this case, all circuit elements of FIG. 3 except $R_c$ justifiably can be omitted from the C. C. region. With this assumption together with previous considerations, the circuit of FIG. 3 can be reduced to the more simplified equivalent circuit model shown in FIG. 4. The operation of the FIG. 4 equivalent circuit model will be described hereinafter for two cases, namely Case 1 with the H. I. C. region in deep depletion and Case 2 with the H. I. C. region in a state of enhanced recombination.

The read-out process for a MOS capacitor structure under Case 1 conditions where the H. I. C. region of the capacitor is in deep depletion will now be discussed. In this condition, the inversion layer potential is positive with respect to the substrate potential. The diode in the FIG. 4 equivalent circuit model is reversed biased and hence can be neglected. The magnitude of the current flowing into the H. I. C. region is proportional to the voltage drop across either $R_0 + R_c$ or $R_1 + R_c$, dependent upon whether the electron beam is impinging in a discharged site or into the charged region, and hence is proportional to the inversion layer potential in the H. I. C. region. As described previously, this potential was shown to depend on the square of the depth of the depletion layer. The ratio of the read-out current when the electron beam is impinging on the charged background to when it impinges on a discharged site is equal to the ratio of $R_1 + R_c$ to $R_0 + R_c$. The current flowing into the H. I. C. region simultaneously decreases the inversion layer potential and increases the value of the depletion layer capacitance. The decrease in inversion layer potential induces a displacement current in the oxide capacitor. Neglecting the current induced change in the depletion layer capacitance and letting $R_L$ equal 0 in FIG. 1A, then the portion of the current flowing into the H. I. C. region that flows through the load resistor $R_L$ is equal to the ratio of the oxide capacitance to the sum of the depletion layer and oxide capacitance. For this reason a high ratio of oxide capacitance to depletion layer capacitance is desirable.

The read-out process for an assumed Case 2 condition where the H. I. C. region is in a state of enhanced recombination will now be considered. In this case the inversion layer potential is negative with respect to the substrate potential. Consequently the diode in the equivalent circuit model of FIG. 4 is forward biased and thus can no longer be neglected. When the switch is in the $R_1$ position in FIG. 4 (i.e. the electron beam impinges into the charged background) the inversion layer potential decreases as in Case 1 discussed above; however, when the interrogating beam is switched to the $R_0$ position (impinges on a discharged site) the potential may increase. The increase is due to discharging of the depletion layer capacitance through the diode. After going through an initial transient phase the average value of the inversion layer potential remains constant. The ac component of the charging potential induces a displacement current through the oxide capacitor so that the average value of the current flowing through $R_L$ in FIG. 1A, is zero after the initial transient.

The effect of the forward biased diode on the current delivered to the load resistor $R_L$ during the initial transient, is best described by ac analysis techniques. The ac resistance of the diode at room temperature is equal to $25/I_{dc}$ ohms, where $I_{dc}$ is the dc component of current flowing into the H. I. C. region, expressed in milliamperes. If this value is small compared to the impedance of the depletion layer capacitance at the signal frequency under consideration, then it does not significantly effect the ac signal delivered to $R_L$. The smaller potential drops across $R_0 + R_c$ or $R_1 + R_c$ and the larger depletion layer capacitance under Case 2 conditions, compared to Case 1, do, however, result in substantially smaller signal currents in Case 2 operations. An even worse situation occurs where the surface conductivity of the inversion layer is poor, even in charged regions. In such a situation, the circuit of FIG. 3 cannot be simplified to the circuit of FIG. 4. The C. C. region is large, and in extreme cases the H. I. C. region may not exist at all. With such a structure, if the ac impedance of the diode is equal to or less than $R_c$, then suppression of the signal would result from current shunted through the diode. The situation then becomes unlike that previously considered above in connection with Case 2 operation, and the dc component of the current can flow through both $R_c$ and the diode and the ac impedance of the diode is not easily determined.

From the foregoing description and comparison of the Case 1 to the Case 2 mode of operation as discussed above, it will be appreciated that considerable benefits can be obtained from deep depletion read-out of MOS memory capacitor structures. This is achieved with the apparatus of FIGS. 1A and 2B as well as the buried layer structure shown in FIG. 2C by initially applying a positive going voltage step across the gate to substrate of the MOS memory capacitor structure just prior to read-out with the read-out interval being for one or more lines of data across the surface of an area of the MOS memory capacitor structure on which data is stored. A single line of data read-out interval is depicted from times $t_1$ to $t_2$ in FIG. 1B(b) during which interval the electron beam is turned on as opposed to being blanked off. During this corresponding interval, the horizontal or X deflection voltage linearly increases from $t_1$ to $t_2$ to cause the electron beam to trace across the line of data bits being read-out while the vertical or Y deflection voltage is held constant. To read-out the next line of data during a successive read-out interval (not shown) the Y deflection voltage would be stepped one increment and the scans repeated throughout whatever number of lines of data are to be read-out.

Just prior to read-out of a first line of data, a positive going voltage step is applied across the gate to substrate of the MOS memory capacitor structure from the variable bias supply under control of the current control logic circuit 17. This positive going voltage step is shown at 21 in FIG. 1B(a). In the event that the state of the memory capacitor structure is such that the gate voltage $V_G$ is equal to $V_{CHARGE}$ just prior to read-out, then the voltage step will occur as the trailing edge of a short duration negative going voltage pulse applied across the memory capacitor structure by causing the variable bias supply 16 to drop from the $V_{CHARGE}$ potential shown in FIG. 1B(a) to the $V_{DISCHARGE}$ level shown at 22 and thereafter rising back to the $V_{READ}$ level thereby producing the positive going voltage step 21 on the trailing edge of the negative voltage pulse. Only a short time duration negative going pulse is required in advance of the positive going step since it is the positive swing of the voltage that produces the deep depletion conditions required for optimum read-out of the line of data.

Having described several embodiments of a new and improved method and apparatus for deep depletion read-out of MOS memory capacitor structures in electron beam addressable memories, it is believed obvious that other modifications and variations of the invention will be suggested to those skilled in the art in the light of the above teachings. It is therefore to be understood that changes may be made in the particular embodiments of the invention described which are within the full intended scope of the invention as defined by the appended claims.

What is claimed is:

1. A method of deep depletion read-out of data stored in a metal-insulator-semiconductor capacitor memory element wherein a predetermined read-out potential is established across the memory capacitor while discrete storage sites are interrogated by an electron beam probe and the magnitude of the resultant electron-hole memory capacitor discharge current obtained from probing a particular site with the electron beam is indicative of the character of data stored at the site; the improvement comprising applying a voltage step across the capacitor memory element just prior to read-out with the electron beam, the voltage step applied to the gate relative to the substrate corresponding in polarity to the polarity of the majority carriers in the underlying semiconductor substrate.

2. A method according to claim 1 wherein the capacitor memory element comprises a metal-oxide-semiconductor capacitor memory element employing an underlying P-type semiconductor substrate, and wherein a positive going voltage step is applied across the capacitor memory element just prior to read-out with the electron beam.

3. A method of deep depletion read-out according to claim 2 wherein the positive going voltage step is produced by the trailing edge of a negative voltage pulse produced in the potential applied across the capacitor memory element just prior to read-out.

4. A method of deep depletion read-out according to claim 3 wherein momentary negative going voltage pulses produced in the potential applied across the capacitor memory element, are provided to the commencement of each line of scan or at the commencement of a sequence of line scans of the electron beam probe.

5. A method of deep depletion read-out according to claim 4 wherein the negative voltage pulses applied across the capacitor memory element at the commencement of the scan of each line or group of lines of the reading electron beam probe start at either a charge or read potential magnitude go to a discharge potential magnitude and return to the read potential magnitude to thereby produce the negative going pulse having a positive going trailing edge occurring at the commencement of the scan of each line or group of lines of the reading electron beam probe.

6. A method of deep depletion read-out according to claim 1 wherein the metal-insulator-semiconductor capacitor memory element possesses capacitance consisting of insulator capacitance and depletion layer capacitance in the semiconductor layer with the ratio of the insulator capacitance to the depletion layer capacitance having a high value.

7. A method of deep depletion read-out according to claim 2 wherein the metal-oxide-semiconductor memory capacitor element exhibits capacitance consisting of oxide layer capacitance and depletion layer capacitance of the semiconductor with the ratio of the oxide layer capacitance to the depletion layer capacitance being high.

8. Apparatus for the deep depletion read-out of data stored in a metal-insulator-semiconductor capacitor memory element including in combination variable voltage bias supply means and scanning electron beam probe means for producing an electron beam probe that is scanned across the surface of the capacitor memory element simultaneously with the application of a bias potential applied across the capacitor memory element from the variable voltage bias supply means, and control circuit means controlling said variable voltage bias supply means for causing the same to apply a voltage step across the capacitor memory element just prior to read-out with the voltage step corresponding in polarity to the polarity of the majority carriers in the underlying semiconductor substrate.

9. Apparatus according to claim 8 wherein the capacitor memory element comprises a metal-oxide-semiconductor capacitor memory element employing an underlying P-type semiconductor substrate, and wherein the control circuit means causes a positive going voltage step to be applied across the capacitor memory element just prior to read-out with the electron beam.

10. Apparatus for deep depletion read-out according to claim 9 wherein the control circuit means causes the positive going voltage step to be produced by the trailing edge of a negative voltage pulse applied by the variable voltage bias supply means across the capacitor memory element just prior to read-out.

11. Apparatus for deep depletion read-out according to claim 10 wherein the control circuit means causes the variable voltage bias supply means to produce a series of negative going voltage pulses in the read potential applied across the capacitor memory element with one pulse being provided at the commencement of the scan of each line or group of lines of the electron beam probe.

12. Apparatus for deep depletion read-out according to claim 11 wherein the negative voltage pulses applied across the capacitor memory element at the commencement of the scan of each line or group of lines of the reading electron beam probe start at either a charge or read potential magnitude go to a discharge potential magnitude and return to the read potential magnitude to thereby produce the negative going pulses having a positive going trailing edge occurring at the commencement of the scan at each line or group of lines of the reading electron beam probe.

13. Apparatus for deep depletion read-out according to claim 8 wherein the metal-insulator-semiconductor capacitor memory element possesses capacitance consisting of insulator capacitance and depletion layer capacitance in the semiconductor layer with the ratio of the insulator capacitance to the depletion layer capacitance having a high value.

14. A method of deep depletion read-out according to claim 9 wherein the metal-oxide-semiconductor memory capacitor element exhibits capacitance consisting of oxide layer capacitance and depletion layer capacitance of the semiconductor with the ratio of the oxide layer capacitance to the depletion layer capacitance being high.

* * * * *